(12) United States Patent
Suzuki et al.

(10) Patent No.: US 8,183,465 B2
(45) Date of Patent: May 22, 2012

(54) COMPONENT BUILT-IN WIRING SUBSTRATE AND MANUFACTURING METHOD THEREOF

(75) Inventors: Shinya Suzuki, Kasugai (JP); Kenichi Saita, Komaki (JP); Shinya Miyamoto, Konan (JP); Shinji Yuri, Kasugai (JP)

(73) Assignee: NGK Spark Plug Co., Ltd., Aichi (JP)

( * ) Notice: Subject to any disclaimer, the term of this patent is extended or adjusted under 35 U.S.C. 154(b) by 412 days.

(21) Appl. No.: 12/575,504

(22) Filed: Oct. 8, 2009

(65) Prior Publication Data

US 2010/0084175 A1 Apr. 8, 2010

(30) Foreign Application Priority Data

Oct. 8, 2008 (JP) ................................. 2008-262013

(51) Int. Cl.
*H05K 1/16* (2006.01)

(52) U.S. Cl. ........ 174/260; 174/250; 361/760; 361/761; 361/763; 361/321.1; 257/723; 257/700

(58) Field of Classification Search .......... 174/250–260; 361/763, 748, 760–761; 257/700, 723
See application file for complete search history.

(56) References Cited

U.S. PATENT DOCUMENTS

| | | | |
|---|---|---|---|
| 6,952,049 B1 * | 10/2005 | Ogawa et al. | 257/700 |
| 7,239,014 B2 * | 7/2007 | Ogawa et al. | 257/700 |
| 7,342,803 B2 * | 3/2008 | Inagaki et al. | 361/763 |
| 7,889,509 B2 * | 2/2011 | Urashima et al. | 361/760 |
| 7,936,567 B2 * | 5/2011 | Takashima et al. | 361/761 |
| 2006/0272853 A1 | 12/2006 | Muramatsu et al. | |

FOREIGN PATENT DOCUMENTS

JP  2007-103789 A  4/2007

* cited by examiner

*Primary Examiner* — Angel R Estrada
*Assistant Examiner* — Dimary Lopez
(74) *Attorney, Agent, or Firm* — Sughrue Mion, PLLC

(57) ABSTRACT

A component built-in wiring substrate (10) which includes: a core substrate (11); a plate-shaped component (101); a resin filling portion (92); and a wiring stacking portion (31), wherein, when viewed from the core principal surface (12) side, the projected area of the mounting area (32) is larger than the projected area of the plate-shaped component (101) and the resin filling portion, and the plate-shaped component and the resin filling portion are positioned directly below the mounting area (23), and wherein a value of the coefficient of thermal expansion (CTE $\alpha 2$) for a temperature range that is equal to or higher than the glass transition temperature of the resin filling portion is set to be larger than a value of the coefficient of thermal expansion of the plate-shaped component and smaller than a value of the coefficient of thermal expansion of the core substrate for the subject temperature range.

20 Claims, 6 Drawing Sheets

COMPONENT BUILT-IN WIRING SUBSTRATE AND MANUFACTURING METHOD THEREOF

BACKGROUND OF THE INVENTION

1. Field of the Invention

The present invention relates to a component built-in wiring substrate in which a plate-shaped component such as a ceramic capacitor is built and a manufacturing method thereof.

2. Description of the Related Art

Recently, there has been an increase in the speed and level of the function of semiconductor integrated circuit elements (IC chips) that are used as microprocessors of computers and the like. Accompanying such a trend, the number of terminals of the IC chips has been increased, and the pitch between the terminals has been decreased. Generally, on the bottom of the IC chip, a plurality of terminals are densely disposed in an array shape, and such a terminal group is connected to a terminal group of the motherboard side in the form of a flip-chip. However, there is a large difference in the pitch of the terminals between the terminal group of the IC chip side and the terminal group of the motherboard side. Thus, it is difficult to connect the IC chip directly to the motherboard. Accordingly, frequently, a technique is employed in which a package formed by mounting the IC chip on the wiring substrate for IC chip mounting is manufactured, and the package is mounted on the motherboard. In the wiring substrate for IC chip mounting that configures such type of package, a technique in which a condenser (also referred to as a "capacitor") is disposed for reducing the switching noise of the IC chip and stabilizing the power source voltage has been proposed. As an example, a wiring substrate has been proposed in which a ceramic capacitor having approximately a plate shape is buried in a core substrate made of a high molecular weight material, and buildup layers are formed on the front face and the rear face of the core substrate (for example, see Patent Document 1).

In particular, in the wiring substrate disclosed in Patent Document 1, the ceramic capacitor is housed in a housing hole portion that is formed on the core substrate made of a resin, and a gap between the inner wall face of the housing hole portion and the ceramic capacitor is filled with a molding resin (resin filling portion) that is formed of an epoxy resin or the like. In addition, on the wiring substrate disclosed in Patent Document 1, terminal pads used for connection to the IC chip are formed in an array shape on one buildup layer, and terminal pads used for connecting to the motherboard are formed in an array shape on the other buildup layer. In addition, in the wiring substrate, solder bumps are disposed in the terminal pads that are disposed on the mounting surface for the IC chip.

[Patent Document 1] Japanese Unexamined Patent Application

Publication No. 2007-103789-A (FIG. 1, etc.)

3. Problems to be Solved by the Invention

The core substrate, the ceramic capacitor and the resin filling portion, which configure the above-described wiring substrate, have different coefficients of thermal expansion (CTE), and accordingly, there are cases where the uppermost layer of the wiring substrate swells due to a mismatch in the coefficients of thermal expansion. Even when a wiring substrate on which an IC chip is not mounted swells by being heated up to the solder melting temperature in a manufacturing process, the swelling disappears as the temperature decreases. However, when an IC chip is mounted on the wiring substrate using a soldering method, solidification of the solder begins before the swelling disappears. Accordingly, the shape of the swelling at that moment is maintained. In such a case, there may be a problem in that the solder bumps are thickened under the influence of the swelling so as to form a short circuit.

In the wiring substrate having the above-described configuration, when the size of the ceramic capacitor to be built into the wiring substrate is larger than that of the IC chip, and the IC chip mounting area is set so as to overlap the upper side of the resin filling portion (for example, the wiring substrate of Patent Document 1), the swelling of the uppermost layer of the substrate becomes small, and thereby there is a low possibility of the solder bumps forming a short circuit. On the contrary, in a wiring substrate in which the size of the IC chip is larger than that of the ceramic capacitor, and an IC chip mounting area larger than the resin filling portion is configured, the swelling of the uppermost layer becomes large, and thus there is high possibility of the solder bumps forming a short circuit.

SUMMARY OF THE INVENTION

The present invention has been made in view of the above-described problems. Accordingly a first object of the present invention is to provide a component built-in wiring substrate capable of suppressing swelling in the mounting area for a chip component and preventing formation of a short circuit of the solder bumps. In addition, a second object of the present invention is to provide a method of manufacturing the above-described component built-in wiring substrate.

In a first aspect, the above objects of the present invention have been achieved by providing a component built-in wiring substrate comprising: a core substrate, which is formed of a resin, including a core principal surface, a core rear surface, and a housing hole portion having an opening on the core principal surface side; a plate-shaped component, which is formed of a ceramic material, that has a component principal surface and a component rear surface and is housed in the housing hole portion in a state in which the core principal surface and the component principal surface are disposed to face a same side; a resin filling portion that is filled in a gap between an inner wall face of the housing hole portion and the plate-shaped component and that fixes the plate-shaped component to the core substrate; and a wiring stacking portion that is formed by alternately stacking resin interlayer insulating layers and a conductive layer on the core principal surface and the component principal surface and that has a plurality of solder bumps disposed inside a mounting area for mounting a chip component configured on the uppermost layer, wherein, when viewed from the core principal surface side, the projected area of the mounting area is larger than the projected area of the plate-shaped component and the resin filling portion, and the plate-shaped component and the resin filling portion are positioned directly below the mounting area, and wherein a value of the coefficient of thermal expansion (CTE α2) for a temperature range that is equal to or higher than the glass transition temperature of the resin filling portion is set to be larger than a value of the coefficient of thermal expansion of the plate-shaped component for said temperature range and is set to be smaller than a value of the coefficient of thermal expansion of the core substrate for said temperature range.

According to the above aspect of the present invention, when viewed from the core principal surface side, the projected area of the mounting area is larger than the projected area of the plate-shaped component and the resin filling portion, and the plate-shaped component and the resin filling portion are positioned directly below the mounting area. Thus, as in the conventional technology, when there is a large mismatch in the coefficients of thermal expansion of the core substrate, the plate-shaped component and the resin filling portion, the mounting area swells. To the contrary, according to the present invention, the coefficient of thermal expansion of the resin filling portion for the temperature range that is equal to or higher than the glass transition temperature is set to be larger than the value of the coefficient of thermal expansion of the plate-shaped component and is set to be smaller than the value of the coefficient of thermal expansion of the core substrate. Accordingly, the mismatch in the coefficients of thermal expansion of the above-described three components for a temperature range in which the solder bumps are melted can be suppressed. As a result, even when the wiring substrate is heated to the solder melting temperature for mounting the chip component, swelling of the mounting area for the chip component can be suppressed so as to present a short circuit of the solder bumps.

In another aspect of the invention, the value of the above-described coefficient of thermal expansion (CTE $\alpha 2$) is to be larger than a value acquired by decreasing a value of the coefficient of thermal expansion of the plate-shaped component for the temperature range by 10% and is set to be smaller than a value acquired by increasing the value of the coefficient of thermal expansion of the core substrate for the temperature range by 10%.

In a preferred embodiment, the absolute value of a difference between the value of the coefficient of thermal expansion (CTE $\alpha 2$) of the resin filling portion for the temperature range that is equal to or higher than the glass transition temperature and a value of the coefficient of thermal expansion (CTE $\alpha 1$) of the resin filling portion for a temperature range that is lower than the glass transition temperature is equal to or smaller than 50 ppm/° C. In such a case, the mismatch of the coefficients of thermal expansion can be suppressed even in the temperature range that is lower than the glass transition temperature. Accordingly, swelling of the mounting area for the chip component can be assuredly suppressed.

In another preferred embodiment, the value of the coefficient of thermal expansion (CTE $\propto 2$) of the resin filling portion for the temperature range that is equal to or higher than the glass transition temperature is equal to or smaller than 90 ppm/° C. In a further preferred embodiment, the value of the coefficient of thermal expansion (CTE $\propto 2$) of the resin filling portion for the temperature range that is equal to or higher than the glass transition temperature is equal to or smaller than 60 ppm/° C. By decreasing the coefficient of thermal expansion of the resin filling portion as described above, mismatch in the coefficients of thermal expansion can be further reduced. Accordingly, swelling of the mounting area for the chip component can be assuredly suppressed.

In yet another preferred embodiment, the Young's modulus of the resin filling portion is equal to or larger than 6.0 GPa. In a further preferred embodiment, the coefficient of extension of the resin filling portion is equal to or smaller than 3.5%. When the resin filling portion having the above-described physical properties is used, the value of the coefficient of thermal expansion for the temperature range that is equal to or higher than the glass transition temperature can be decreased. Accordingly, swelling of the mounting area for the chip component can be assuredly suppressed.

In yet another preferred embodiment, the resin of the resin filling portion contains an inorganic filler, and the content of the inorganic filler is equal to or larger than 50 wt % based on the weight of the filler and epoxy resin. When the resin filling portion is configured as such, the value of the coefficient of thermal expansion for the temperature range that is equal to or higher than the glass transition temperature can be decreased. Accordingly, swelling of the mounting area for the chip component can be assuredly suppressed.

The material that forms the core substrate is not particularly limited. Preferably, the core substrate is formed using a high molecular weight material as its major body. Specific examples of the high molecular weight material useful for forming the core substrate include EP resin (epoxy resin), PI resin (polyimide resin), BT resin (bismaleimide triazine resin), PPE resin (polyphenylene ether resin), and the like. Instead of the above-described resins, a compound material that is formed by the above-described resin and an organic fiber such as a glass fiber (a glass woven fabric or a glass nonwoven fabric) or a polyamide fiber may be used.

The plate-shaped component made of a ceramic material is not particularly limited. An appropriate example of the plate-shaped component is a ceramic capacitor. The ceramic capacitor has a structure in which a plurality of internal electrode layers is disposed so as to be stacked through a ceramic dielectric layer. An example of the ceramic capacitor is a ceramic capacitor that has a structure in which a plurality of internal electrode layers are disposed so as to be stacked through a ceramic dielectric layer, and which includes a plurality of in-capacitor via conductors connected to respective ones of the plurality of internal electrode layers, and a plurality of surface layer electrodes connected to at least end portions of the plurality of respective ones of the in-capacitor via conductors that are located on the component principal surface side. In addition, in the ceramic capacitor, the plurality of in-capacitor via conductors are arranged in an array so as to define a ceramic capacitor. When such a structure is used, the inductance of the capacitor is decreased. Therefore, noise can be absorbed, and a high-speed supply of the power source for smoothing variation in the power source can be implemented. In addition, miniaturization of the entire capacitor can be easily achieved. Moreover, miniaturization of the entire component built-in wiring substrate can be easily achieved. Furthermore, a high static capacitance can be easily realized with respect to size, and accordingly, power can be supplied in a more stable manner.

Example of the ceramic dielectric layer that configures the ceramic capacitor include a sintering body formed of a high-temperature fired ceramic such as alumina, aluminum nitride, boron nitride, silicon carbide, or silicon nitride, and a sintering body of a low-temperature fired ceramic such as a glass ceramic that is formed by adding an inorganic ceramic filler such as alumina to borosilicate-based glass or borosilicate lead-based glass is also appropriately used. In such a case, a sintering body of a dielectric ceramic such as barium titanate, lead titanate, or strontium titanate is preferably used depending on the intended application. When the sintering body of the dielectric ceramic is used, it is easy to implement a capacitor having a large capacitance.

The internal electrode layer, the in-capacitor via conductor, and the surface layer electrode are not particularly limited. For example, in a case where the dielectric layer is a ceramic dielectric layer, a metalized conductor is preferably used for the internal electrode layer, the in-capacitor via conductor, and the surface layer electrode.

Useful examples of the formation material of the resin interlayer insulating layer include a thermosetting resin such as an epoxy resin, a phenol resin, an urethane resin, a silicon resin, or a polyimide resin and a thermoplastic resin such as a polycarbonate resin, an acrylic resin, a polyacetal resin, or a polypropylene resin. Other than the above-described materials, a compound material of the above-described resin and an organic fiber such as a glass fiber (a glass woven fiber or a glass nonwoven fiber) or a polyamide fiber or a resin-resin compound material formed by impregnating a thermosetting resin such as an epoxy resin into the base of a three-dimensional net-shaped fluorine series resin such as a concatenated porous PTFE may be used.

The above-described conductive layer is patterned so as to be formed on the resin interlayer insulating layer using a known technique such as a subtractive method, a semi-additive method, or a full-additive method. Examples of the metal material that is used for forming the conductive layer include copper, copper alloy, nickel, nickel alloy, tin, and tin alloy.

In the above-described aspects of the invention, the coefficient of thermal expansion (CTE α2) of the resin filling portion for the temperature range that is equal to or higher than the glass transition temperature, that is, a high-temperature range has been specified. However, the coefficient of thermal expansion (CTE α1) for a temperature range lower than the glass transition temperature may also be specified. Although there are cases where the component built-in wiring substrate is exposed to a high temperature in a manufacturing process, the component built-in wiring substrate is not exposed to such a high temperature at the time of use thereafter. However, when the IC chip operates, the temperature rises due to heat dissipation of the IC chip. Accordingly, the upper portion of the resin filling portion expands with the rise in temperature. Therefore, even for the low temperature range, there is a need to reduce the influence of mismatch in the coefficients of thermal expansion.

Thus, in yet another aspect for solving the above-described problems, the present invention provides a component built-in wiring substrate comprising: a core substrate, which is formed of a resin, including a core principal surface, a core rear surface, and a housing hole portion having an opening on the core principal surface side; a plate-shaped component, which is formed of a ceramic material, that has a component principal surface and a component rear surface and is housed in the housing hole portion in a state in which the core principal surface and the component principal surface are disposed to face a same side; a resin filling portion that is filled in a gap between an inner wall face of the housing hole portion and the plate-shaped component and that fixes the plate-shaped component to the core substrate; and a wiring stacking portion that is formed by alternately stacking resin interlayer insulating layers and a conductive layer on the core principal surface and the component principal surface and that has a plurality of solder bumps disposed inside a mounting area for mounting a chip component configured on the uppermost layer, wherein, when viewed from the core principal surface side, the projected area of the mounting area is larger than the projected area of the plate-shaped component and the resin filling portion, and the plate-shaped component and the resin filling portion are positioned directly below the mounting area, and wherein a value of the coefficient of thermal expansion (CTE α1) for a temperature range that is lower than the glass transition temperature of the resin filling portion is set to be larger than a value of the coefficient of thermal expansion of the plate-shaped component for said temperature range and is set to be smaller than a value of the coefficient of thermal expansion of the core substrate for said temperature range. In addition, the value of the coefficient of thermal expansion (CTE α1) for said temperature range is set to be larger than a value that is acquired by decreasing the value of the coefficient of thermal expansion of the plate-shaped component for the temperature range by 10% and is set to be smaller than a value that is acquired by increasing the value of the coefficient of thermal expansion of the core substrate for the temperature range by 10%.

BRIEF DESCRIPTION OF THE DRAWINGS

Illustrative aspects of the invention will be described in detail with reference to the drawings wherein.

DETAILED DESCRIPTION OF THE PREFERRED EMBODIMENTS

Hereinafter, an embodiment of the present invention will be described in detail with reference to drawings. However, the present invention should not be construed as being limited thereto.

Figure 1:
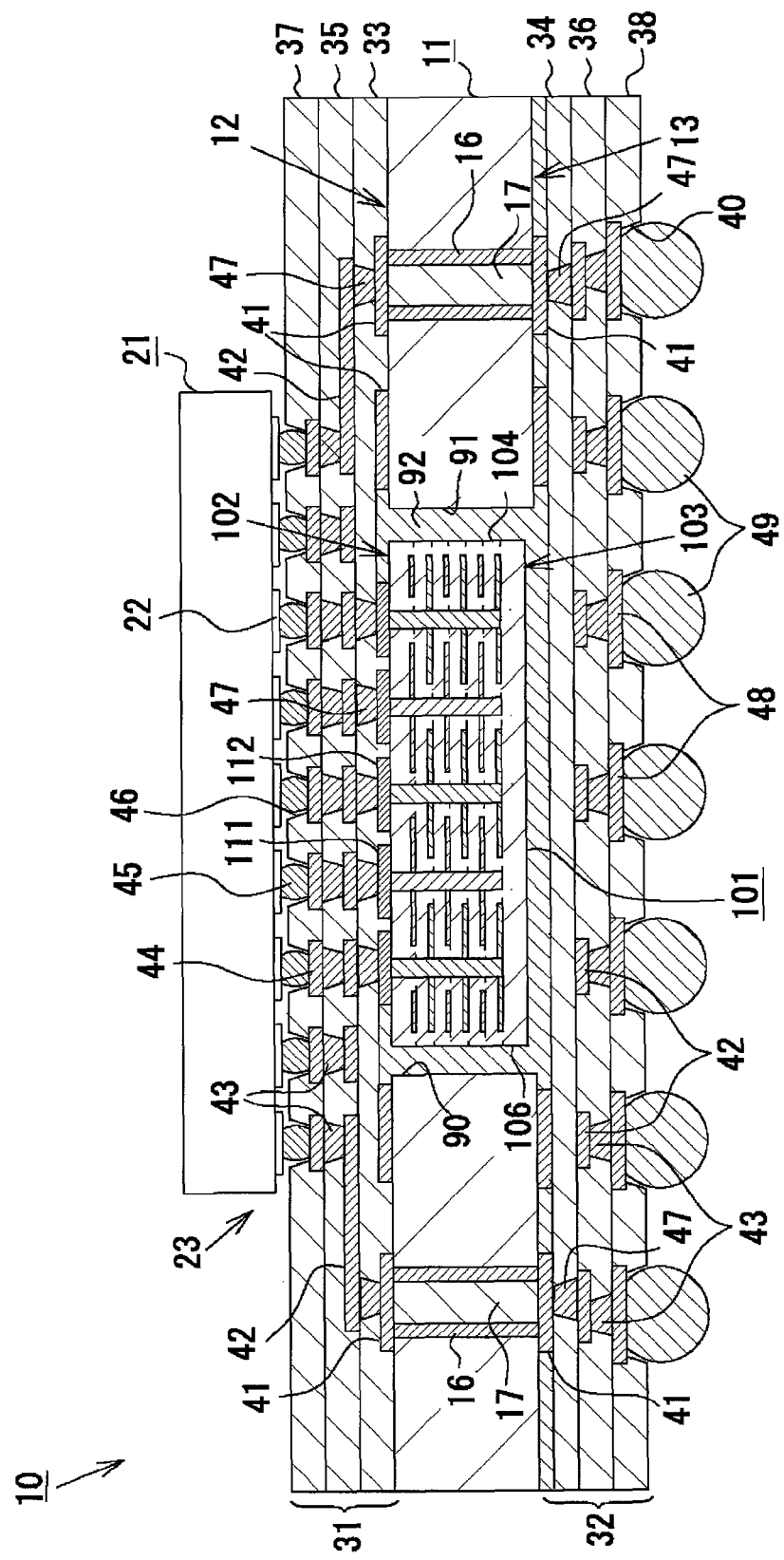
FIG. 1 is a schematic cross-sectional view of a component built-in wiring substrate according to an embodiment of the invention.

As shown in FIG. 1, a component built-in wiring substrate 10 according to this embodiment is configured by a core substrate 11 made of a resin, a first buildup layer 31 (wiring stacking portion) that is formed on a core principal surface 12 (a top face in FIG. 1) of the core substrate 11, and a second buildup layer 32 that is formed on a core rear surface 13 (a bottom face in FIG. 1) of the core substrate 11.

The core substrate 11 has an approximately rectangular plate shape in plan view, which has a vertical length of 25 mm×a horizontal width of 25 mm×a thickness of 1.0 mm. In a plurality of spots located on this core substrate 11, through hole conductors 16 are formed. The through hole conductor 16 allows for electrical connection between the core principal surface 12 side and the core rear surface 13 side of the core substrate 11. In addition, the inside of the through hole conductor 16, for example, is filled up with a blocking body 17 such as an epoxy resin. In addition, on the core principal surface 12 and the core rear surface 13 of the core substrate 11, a conductive layer 41 made of copper is formed by patterning, and a conductive layer 41 is electrically connected to an associated through hole conductor 16.

The first buildup layer 31 formed on the core principal surface 12 of the core substrate 11 has a structure in which two resin interlayer insulating layers 33 and 35 formed of thermosetting resin (epoxy resin) and a conductive layer 42 formed of copper are alternately stacked. In addition, in a plurality of spots on the surface of the resin interlayer insulating layer 35 as a second layer, terminal pads 44 are formed in an array shape. Almost the entire surface of the resin interlayer insulating layer 35 is covered with a solder resist 37. In predetermined spots of the solder resist 37, opening portions 46 that are used for exposing the terminal pads 44 are formed. A plurality of solder bumps 45 is disposed on the surfaces of the terminal pads 44. Individual ones of the solder bumps 45 are electrically connected to a surface connection terminal 22 of an IC chip 21 (chip component) that forms a rectangular flat plate shape. In addition, an area in which the terminal pad 44 and the solder bump 45 are formed is a mounting area for mounting the IC chip 21. The mounting area 23 for the IC chip 21 is configured as the uppermost surface layer of the first buildup layer 31. In addition, via conductor 43 and 47 are disposed inside the resin interlayer insulating layers 33 and 35, respectively. These via conductors 43 and 47 electrically connect the conductive layer 42 and the terminal pad 44 to each other.

The second buildup layer 32 formed on the core rear surface 13 of the core substrate 11, similarly to the above-described first buildup layer 31, has a structure in which two resin interlayer insulating layers 34 and 36 formed of thermosetting resin (epoxy resin) and a conductive layer 42 are alternately stacked. In addition, in a plurality of spots on the bottom surface of the resin interlayer insulating layer 36 as a second layer, BGA (ball grid array) pads 48 that are electrically connected to the conductive layer 42 through the via conductor 43 are formed in an array shape. Almost the entire bottom surface of the interlayer insulating layer 36 is covered with a solder resist 38. In predetermined spots of the solder resist 38, opening portions 40 that are used for exposing the BGA pads 48 are formed. A plurality of solder bumps 49 for electrical connection to a motherboard is disposed on the surfaces of the BGA pads 48. The component built-in wiring substrate 10 shown in FIG. 1 is connected to the motherboard by the solder bumps 49.

The core substrate 11 has a housing hole portion 90 formed in a rectangular shape in plan view, which opens in the center portion of the core principal surface 12 and the center portion of the core rear surface 13. In other words, the housing hole portion 90 is a through hole portion. A ceramic capacitor 101 is housed inside the housing hole portion 90 so as to be buried therein. The ceramic capacitor 101 of this embodiment has a rectangular flat plate shape having a vertical length of 10.0 mm×a horizontal length of 10.0 mm×a thickness of 0.9 mm. In other words, the ceramic capacitor 101 is formed so as to be thinner than the core substrate 11. The ceramic capacitor 101 is disposed in an area located directly below the above-described mounting area 23 of the core substrate 11.

Figure 2:
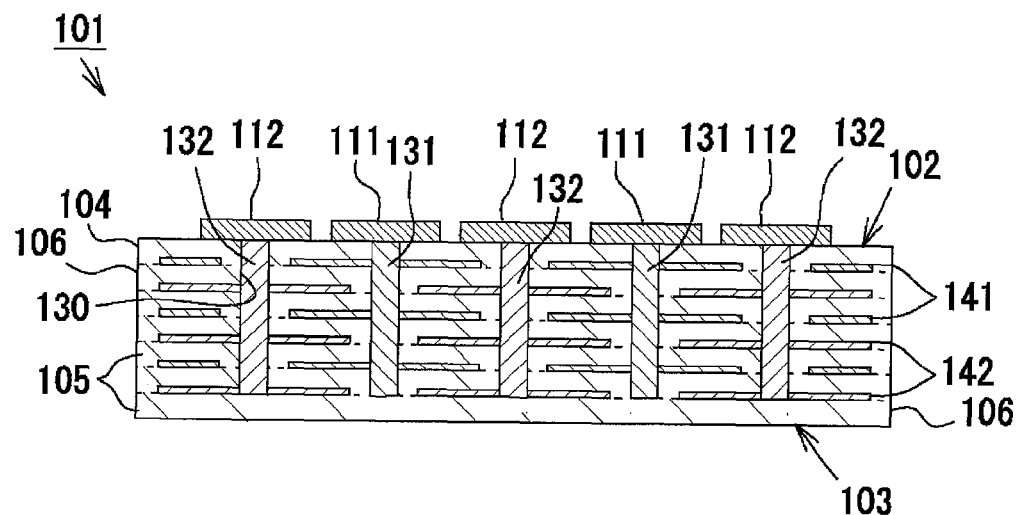
FIG. 2 is a schematic cross-sectional view of a ceramic capacitor.
Figure 3:
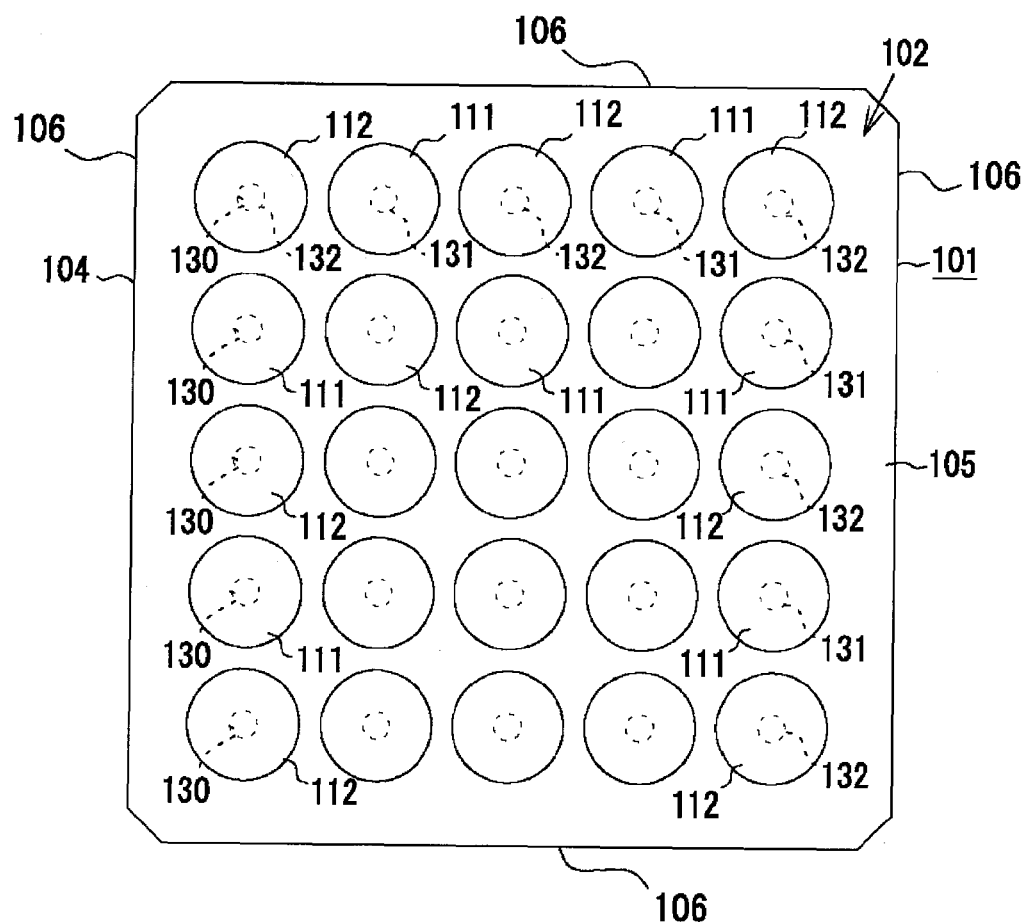
FIG. 3 is a plan view of a ceramic capacitor.

As shown in FIGS. 1 to 3, the ceramic capacitor 101 of this embodiment is a so-called via-array-type capacitor. A ceramic sintering body 104 that constitutes the ceramic capacitor 101 is a plate-shaped component that has one capacitor principal surface 102 (the top surface in FIG. 2) that is the component principal surface, one capacitor rear surface 103 (the bottom surface in FIG. 2) that is the component rear surface, and four capacitor side surfaces 106 (the left surface and the right surface in FIG. 2).

As shown in FIG. 2, the ceramic sintering body 104 has a structure in which an internal electrode layer 141 (internal electrode) for the power source and an internal electrode layer 142 (internal electrode) for the ground are alternately stacked through a ceramic dielectric layer 105. In addition, the ceramic dielectric layer 105 is constituted by a sintering body formed of barium titanate that is one type of high dielectric-constant ceramic and serves as a dielectric body (insulating body) between the internal electrode layer 141 for the power source and the internal electrode layer 142 for the ground. Both the internal electrode layer 141 for the power source and the internal electrode layer 142 for the ground are layers that are formed using nickel as a main ingredient and are disposed every other layer inside the ceramic sintering body 104, respectively.

As shown in FIGS. 1 to 3, a plurality of via holes 130 are formed in the ceramic sintering body 104. These via holes 130 are formed in the thickness direction of the ceramic sintering body 104 and are disposed in a matrix shape (array shape) over the entire surface of the ceramic sintering body 104. Inside each via hole 130, a plurality of in-capacitor via conductors 131 and 132 are formed using nickel as a main ingredient. In this embodiment, the diameter of the via hole 130 is configured to be about 100 µm, and, accordingly, the diameter of each of the in-capacitor via conductors 131 and 132 is also configured to be about 100 µm. Each in-capacitor via conductor 131 for the power source penetrates the internal electrode layer 141 for the power source, and the in-capacitor via conductor 131 for the power source and the internal electrode layer 141 for the power source are electrically connected to each other. Each in-capacitor via conductor 132 for the ground penetrates the internal electrode layer 142 for the ground, and the in-capacitor via conductor 132 for the ground and the internal electrode layer 142 for the ground are electrically connected to each other. The in-capacitor via conductors 131 for the power source and the in-capacitor via conductors 132 for the ground are disposed in an array shape as a whole. In this embodiment, for convenience of description, the in-capacitor via conductors 131 and 132 of 5 rows×5 columns are shown in the drawings. However, in practical applications, more rows and columns are present.

As shown in FIGS. 2 and 3, on the capacitor principal surface 102 of the ceramic sintering body 104, a plurality of front-side external electrodes 111 (surface-layer electrode) for the power source and a plurality of front-side external electrodes 112 (surface-layer electrode) for the ground are disposed. The front-side external electrode 111 for the power source is directly connected to the end face of the in-capacitor via conductor 131 for the power source that is located on the capacitor principal surface 102 side. In addition, the front-side external electrode 112 for the ground is directly connected to the end face of the in-capacitor via conductor 132 for the ground that is located on the capacitor principal surface 102 side.

The external electrodes 111 and 112 have a layered structure in which a copper plating layer is deposited on a metalized layer formed using nickel as a main ingredient. The copper plating layer is formed of metal that is softer than the metal that configures the metalized layer. In addition, the surface of the cooper plating layer is roughened. Accordingly, the surface of the external electrodes 111 and 112 is formed to be rougher than the top surface 102 of the ceramic sintering body 104. In addition, each of the external electrodes 111 and 112 forms an approximately circular shape, in the view acquired in the direction (thickness direction of the component) perpendicular to the top surface 102.

As shown in FIG. 1, the external electrodes 111 and 112 of the ceramic capacitor 101 are connected to the via conductor 47 that is formed in the resin interlayer insulating layer 33 and are electrically connected to the IC chip 21 through the via conductor 47, the conductive layer 42, the via conductor 43, the terminal pad 44, the solder bump 45, and the surface connection terminal 22 of the IC chip 21.

Figure 4:
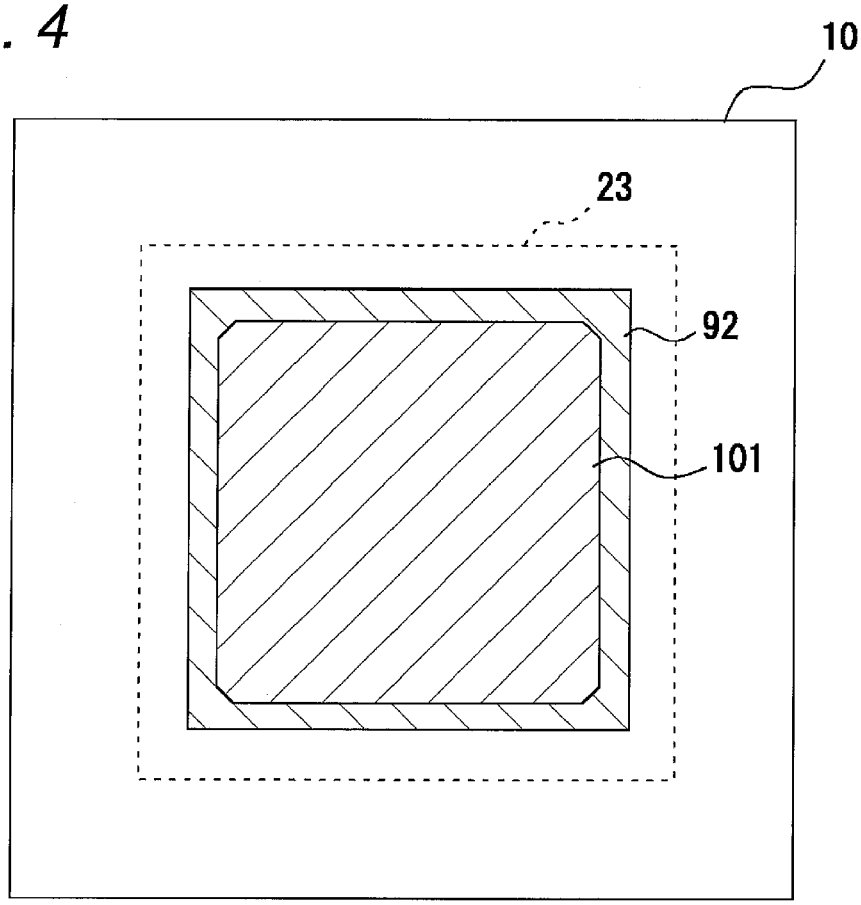
FIG. 4 is an explanatory diagram of an IC-chip mounting area, a resin filling portion and a ceramic capacitor.

A resin filling portion 92 that is formed of a high molecular weight material is filled in a gap between the inner wall face 91 of the housing hole portion 90 and the capacitor-side surface 106 of the ceramic capacitor 101. The resin filling portion 92 is disposed so as to cover the capacitor rear surface 103 of the ceramic capacitor 101 inside the housing hole portion 90. The resin filling portion 92 is elastically deformable so as to absorb deformation of the ceramic capacitor 101 and the core substrate 11 in the face direction or the thickness direction, and also fixes the ceramic capacitor 101 to the core substrate 11. As shown in FIG. 4, when the component built-in wiring substrate 10 is viewed from the core principal surface side, the projected area of the mounting area 23 for the IC chip 21 is configured to be larger than that of the ceramic capacitor 101 and the resin filling portion 92. The ceramic capacitor 101 and the resin filling portion 92 are located directly below the mounting area 23 for the IC chip 21.

The resin filling portion 92 of this embodiment is a molding resin comprising an epoxy resin and a silica filler (inorganic filler), and a resin material having a low coefficient of thermal expansion (CTE) is used for the resin filling portion 92. In this embodiment, a silica filler in an amount of 68 wt % based on the weight of the filler and epoxy resin is contained in the epoxy resin of the resin filling portion 92. The coefficient of thermal expansion of the resin filling portion 92 has a value of 21 ppm/° C. for the first temperature range $\alpha 1$ (a temperature range of 25° C. to 155° C. that is lower than the glass transition temperature) and a value of 57 ppm/° C. for the second temperature range $\alpha 2$ (a temperature range of 155° C. to 240° C. that is equal to or higher than the glass transition temperature), which are measured by TMA (thermal mechanical analysis). In addition, the glass transition temperature (Tg) of the resin filling portion 92 has a value of 155° C. as measured by TMA and has a value of 184° C. as measured by dynamic viscoelastic analysis (DMA). The Young's modulus of the resin filling portion 92 is 7.6 GPa, and the tension strength thereof is 90 MPa, and the coefficient of extension is 1.7%.

In the resin interlayer insulating layers 33 to 36 that configure the buildup layers 31 and 32, a silica filler in an amount of 38 wt % based on the weight of the filler and epoxy resin is contained with respect to the epoxy resin. The coefficient of thermal expansion of the resin interlayer insulating layers 33 to 36 is configured to be 39 ppm/° C. for the first temperature range $\alpha 1$ and 161 ppm/° C. for the second temperature range $\alpha 2$. In addition, the glass transition temperature (Tg) of the resin interlayer insulating layers 33 to 36 has a value of 156° C. as measured by TMA and a value of 177° C. as measured by DMA. The Young's modulus of the resin interlayer insulating layers 33 to 36 is 3.5 GPa, the tension strength thereof is 93 MPa, and the coefficient of extension is 5.0%.

In addition, as for the characteristics of the core substrate 11, the coefficient of thermal expansion is 27.3 ppm/° C. for the first temperature range $\alpha 1$ and 148 ppm/° C. for the second temperature range $\alpha 2$, and the Young's modulus is 22.2 GPa. In addition, as for the characteristics of the ceramic capacitor 101, the coefficient of thermal expansion is 4.6 ppm/° C. for the first temperature range $\alpha 1$ and 11.7 ppm/° C. for the second temperature range $\alpha 2$, and the Young's modulus is 120 GPa.

Here, "TMA" is defined by JPCA-BU01-2007, and "DMA" is defined by JIS C 6481-1996.

Next, a method of manufacturing the component built-in wiring substrate 10 according to this embodiment will be described.

Figure 5:
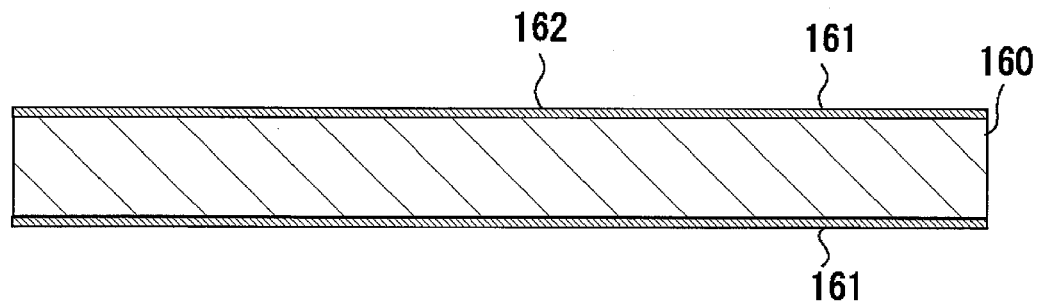
FIG. 5 is an explanatory diagram illustrating a method of manufacturing a component built-in wiring substrate.

First, in a core substrate preparing process, the core substrate 11 having a housing hole portion 90 is manufactured and prepared using a known technique. The core substrate 11 is manufactured as follows. A copper-clad laminate 162 (see FIG. 5) obtained by attaching copper foils 161 to both sides of a resin base material 160 is prepared. Then, a hole drilling process is performed for the copper-clad laminate 162 using a drilling machine, and a through hole used for forming the through hole conductor 16 is formed in advance in a predetermined position.

Figure 6:
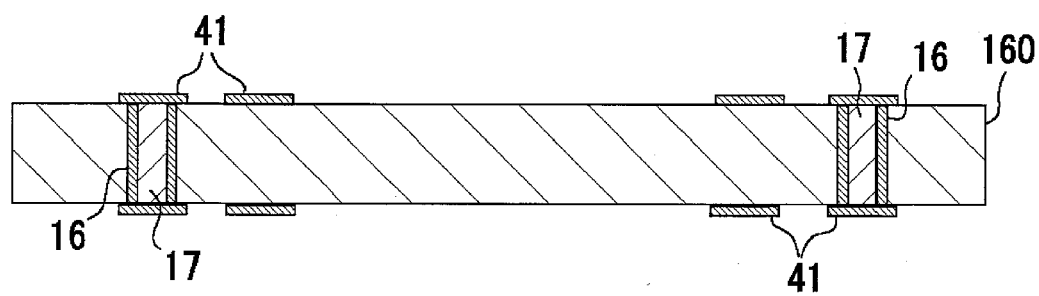
FIG. 6 is an explanatory diagram illustrating a method of manufacturing a component built-in wiring substrate.
Figure 7:
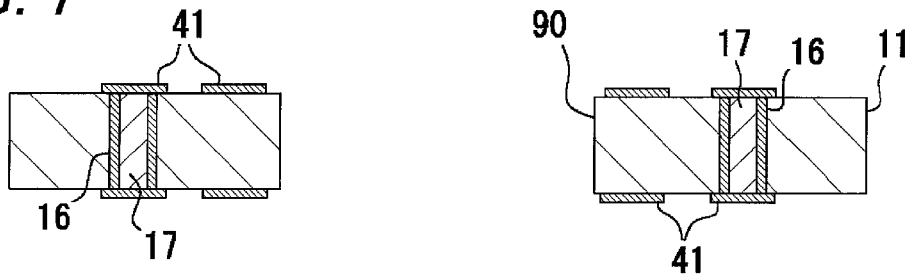
FIG. 7 is an explanatory diagram illustrating a method of manufacturing a component built-in wiring substrate.

Thereafter, the through hole conductor 16 is formed by an electroless copper plating process and an electrolytic copper plating process using known techniques. Next, the blocking body 17 is formed by printing a paste having an epoxy resin as its main ingredient into a hollow portion of the through hole conductor 16 and then curing the printed paste. Then, the conductive layer 41 is patterned, for example, using a subtractive method by etching the copper foils 161 of both sides of the copper-clad laminate 162 (see FIG. 6). In particular, after carrying out electroless copper plating, electrolytic copper plating is conducted while using the electroless copper plating layer as a common electrode. Then, a dry film is laminated, and the dry film is formed in a predetermined pattern by performing an exposure process and a developing process for the dry film. In this state, an electrolytic copper plating layer, an electroless copper plating layer, and the copper foils 161 that are not needed are eliminated by etching, and then the dry film is peeled off. Thereafter, hole processing is performed using a router, and the housing hole portion 90 is formed in a predetermined position, whereby the core substrate 11 is obtained (see FIG. 7).

In addition, in a component preparing process, the ceramic capacitor 101 is manufactured and prepared in advance using a known technique.

The ceramic capacitor 101 is manufactured as follows. A green sheet formed of a dielectric material having barium titanate as its major ingredient is formed, and nickel paste for an internal electrode layer is screen-printed on the green sheet and dried. Accordingly, an internal electrode portion for the power source that later becomes the internal electrode layer 141 for the power source and an internal electrode portion for the ground that becomes the internal electrode layer 142 for the ground are formed. Next, the green sheet in which the internal electrode portion for the power source is formed and the green sheet in which the internal electrode portion for the ground is formed are alternately staked and pressurized in the sheet lamination direction. Accordingly, the green sheets are integrated so as to form a green sheet laminated body.

Then, a plurality of via holes 130 is formed in the green sheet laminated body using a laser processing machine, and nickel paste that used for via conductors is filled into the via holes 130 using a paste press-fitting and filling device. Next, nickel paste that is used for the via electrode is printed on the top face of the green sheet laminated body, and the external electrodes 111 and 112 are formed so as to cover the top end face of the conductive portions on the top face side of the green sheet laminated body.

Thereafter, the green sheet laminated body is dried, and the external electrodes 111 and 112 are solidified to some degree. Next, the green sheet laminated body is degreased and baked again at a predetermined temperature for a predetermined time. As a result, barium titanate and nickel contained in the paste are simultaneously sintered to obtain the ceramic sintering body 104.

Next, an electroless copper plating (a thickness of about 10 μm) process is carried out for making the external electrodes 111 and 112 of the previously obtained ceramic sintering body 104. As a result, copper plating layers are formed on the external electrodes 111 and 112. In addition, an intermediate product is manufactured for forming a plurality of products in which a plurality of product regions to become the ceramic capacitors 101 is aligned horizontally and vertically along the planar direction. Then, by dividing the intermediate product for forming a plurality of products, a plurality of the ceramic capacitors 101 as individual products can be simultaneously obtained.

Figure 8:
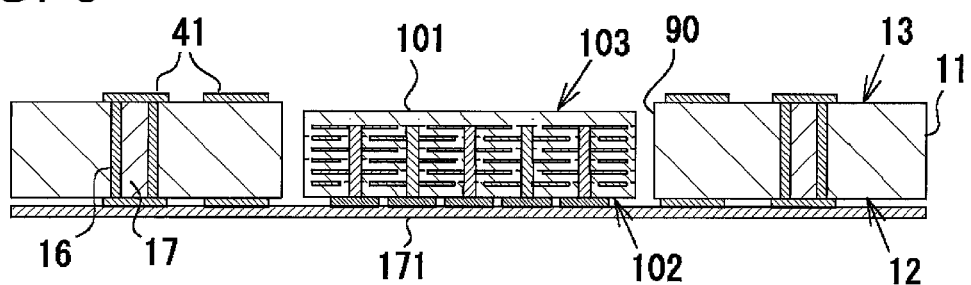
FIG. 8 is an explanatory diagram illustrating a method of manufacturing a component built-in wiring substrate.

Then, in a housing process, the ceramic capacitor 101 is housed in the housing hole portion 90 in a state in which the core principal surface 12 and the capacitor principal surface 102 are disposed to face a same side (the lower side in FIG. 8), and the core rear surface 13 and the capacitor rear surface 103 are disposed to face a same side (the upper side in FIG. 8) using a mounting device (manufactured by Yamaha Motor. Co., Ltd). The opening of the housing hole portion 90 that is located on the core principal surface 12 side is sealed with an adhesive tape 171 that can be peeled off. This adhesive tape 171 is supported by a support board. To the adhesive surface of the adhesive tape 171, the ceramic capacitor 101 is attached so as to be temporarily fixed. Since the ceramic capacitor 101 is formed to be thinner than the core substrate 11, a level difference is generated between the core rear surface 13 and the capacitor rear surface 103.

Figure 9:
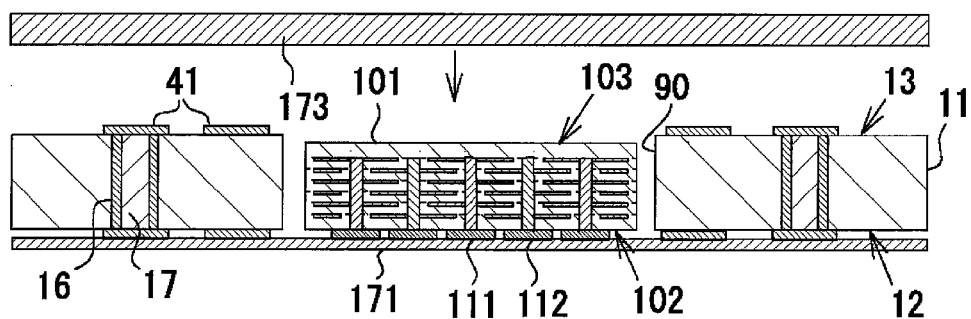
FIG. 9 is an explanatory diagram illustrating a method of manufacturing a component built-in wiring substrate.
Figure 10:
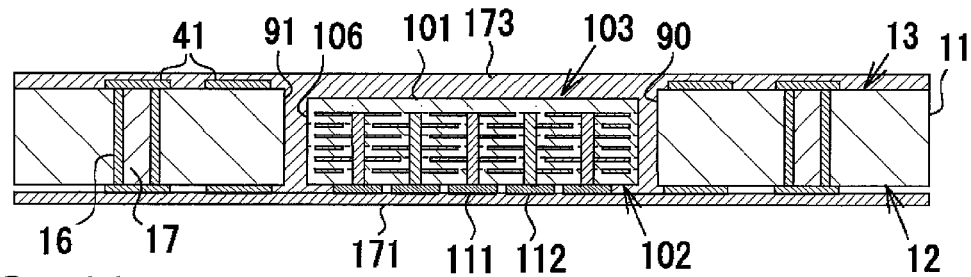
FIG. 10 is an explanatory diagram illustrating a method of manufacturing a component built-in wiring substrate.

In the following resin filling process, an uncured epoxy resin film 173 (a buildup material manufactured by Ajinomoto Co., Inc.; product name: ABF-TH3) having a sheet shape is laminated on the core rear surface 13 and the capacitor rear surface 103 (see FIG. 9). Here, the epoxy resin film 173 is heated and pressurized under a decompressed environment using a known vacuum lamination method, and whereby the epoxy resin film 173 is tightly attached to the core rear surface 13 and the capacitor rear surface 103. At this moment, a part of the epoxy resin film 173 is melted, and the gap between the inner wall face 91 of the housing hole portion 90 and the capacitor side surface 106 is filled up by dropping in the melted resin material (see FIG. 10). In the following fixing process, the epoxy resin film is cured by performing a heating process (curing and the like), and the ceramic capacitor 101 is fixed to the core substrate 11.

Thereafter, the epoxy resin film 173 located on the core rear surface 13 and the capacitor rear surface 103 is removed by polishing, for example, using a belt sander, and the surface of the conductive layer 41 that is formed on the core rear surface 13 is exposed. Then, at this moment, the adhesive tape 171 is peeled off. Since the surfaces of the external electrodes 111 and 112 and the surface of the conductive layer 41 located on the core principal surface 12 are brought into contact with the adhesive tape 171, the surfaces are formed at the same height even without polishing. In addition, a part of the epoxy resin film 173 that is dropped into the gap between the inner wall face 91 of the housing hole portion 90 and the capacitor side surface 106 becomes the resin filling portion 92. Then, inside the housing hole portion 90, the resin filling portion 92 is formed so as to fill the level difference between the capacitor rear surface 103 of the ceramic capacitor 101 and the core rear surface 13 of the core substrate 11, and the capacitor rear surface 103 side of the ceramic capacitor 101 is coated with the resin filling portion 92.

Figure 11:
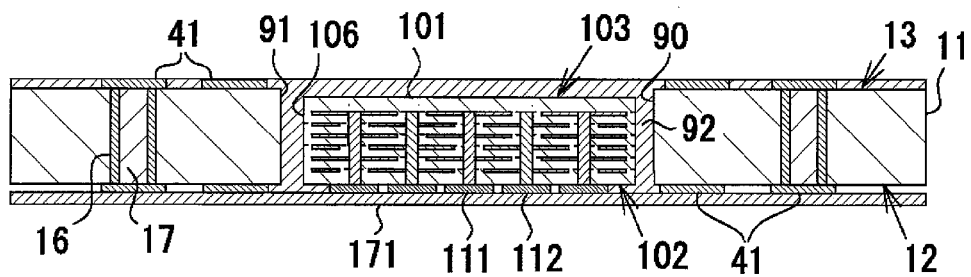
FIG. 11 is an explanatory diagram illustrating a method of manufacturing a component built-in wiring substrate.
Figure 12:
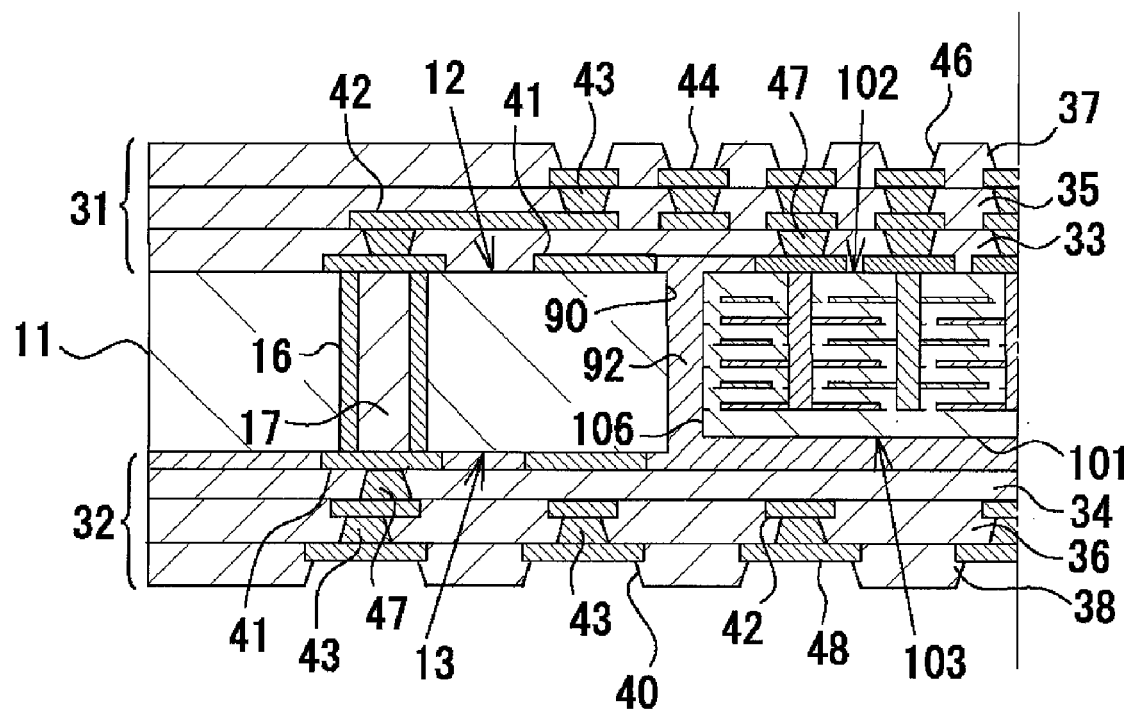
FIG. 12 is an explanatory diagram illustrating a method of manufacturing a component built-in wiring substrate.

Next, based on a known buildup method, the buildup layer 31 is formed on the top surface 12 of the core substrate 11, and the buildup layer 32 is formed on the bottom surface 13 of the core substrate 11 (see FIG. 12). In addition, FIG. 12 represents a state in which the top and bottom surfaces of the core substrate 11 represented in FIG. 11 and the ceramic capacitor 101 are vertically inverted (a state at the time of chip mounting).

As described in more detail, first, the core principal surface 12 and the core rear surface 13 of the core substrate 11 are laminated with an epoxy resin film (a buildup material manufactured by Ajinomoto Co., Inc.; product name: ABF-GX13), together with the resin interlayer insulating layers 33 and 34 serving as the first layer having blind holes in positions in which the via conductors 47 are to be formed. The blind holes are formed using a laser processing machine. Alternatively, the resin interlayer insulating layers 33 and 34 may be formed by coating with a thermosetting epoxy resin that is in the liquid phase, instead of laminating with the epoxy resin film. Next, an electrolytic copper plating process is performed using a known technique (for example, a semi-additive method), and the conductive layer 42 is formed on the resin interlayer insulating layers 33 and 34 together with forming the via conductors 47 inside the above-described blind holes.

Then, the epoxy resin film is laminated on the resin interlayer insulating layers 33 and 34 serving as the first layer, together with the resin interlayer insulating layers 35 and 36 serving as the second layer having blind holes in positions in which the via conductors 43 are formed. The blind holes are formed using a laser processing machine. Alternatively, the resin interlayer insulating layers 35 and 36 may be formed by coating with a thermosetting epoxy resin that is in the liquid phase, instead of laminating with the epoxy resin film. Next, an electrolytic copper plating process is performed using a conventional known technique, and the terminal pad 44 is formed on the resin interlayer insulating layer 35 together with forming the via conductors 43 inside the above-described blind holes. Then, a BGA pad 48 is formed on the resin interlayer insulating layer 36.

Next, the solder resists 37 and 38 are formed by coating the resin interlayer insulating layers 35 and 36 serving as the second layer with a photosensitive epoxy resin and curing the photosensitive epoxy resin. Thereafter, an exposure process and a developing process are performed for the solder resists in a state in which a predetermined mask is disposed, and the opening portions 46 and 40 are patterned in the solder resists 37 and 38. As a result, the buildup layers 31 and 32 are formed on the top surface 12 and the bottom surface 13 of the core substrate 11.

Then, a solder bump 45 is formed on the terminal pad 44, and the solder bump 49 is formed on the BGA pad 48. In addition, the resultant substrate of this state can be regarded as a wiring substrate for forming multiple products in which a plurality of the product regions to be the component built-in wiring substrates 10 is disposed vertically and horizontally along the planar direction. Then, by dividing the wiring substrate for forming a plurality of products, a plurality of the component built-in wiring substrates 10 as individual products can be simultaneously obtained.

As a result, according to this embodiment, the following advantages can be realized.

(1) In the case of the component built-in wiring substrate 10 according to this embodiment, the value (=57 ppm/° C.) of the coefficient of thermal expansion of the resin filling portion 92 for the second temperature range $\alpha 2$, which is equal to or higher than the glass transition temperature, is set to be larger than that (=11.7 ppm/° C.) of the ceramic capacitor 101 and to be smaller than that (=148 ppm/° C.) of the core substrate 11. In such a case, in the temperature range in which the solder bump 45 is melted, the mismatch of the coefficients of thermal expansion of the core substrate 11, the ceramic capacitor 101, and the resin filling portion 92 can be suppressed. Accordingly, even when the component built-in wiring substrate 10 is heated up to the solder melting temperature in mounting the IC chip 21, the swelling of the mounting area 23 for the IC chip 21 can be suppressed, whereby the problem of forming a short circuit of the solder bump 45 can be prevented. As a result, the electrical connection between the component built-in wiring substrate 10 and the IC chip 21 can be implemented assuredly, and the reliability of the product can be improved.

(2) In the case of the component built-in wiring substrate 10 according to this embodiment, the value of the coefficient of thermal expansion of the resin filling portion 92 for the second temperature range α2, which is equal to or higher than the glass transition temperature, is set to 57 ppm/° C., the value of the coefficient of thermal expansion thereof for the first temperature range α1, which is lower than the glass transition temperature, is 21 ppm/° C., and the absolute value of a difference thereof is set to be equal to or smaller than 50 ppm/° C. In addition, the value of the coefficient of thermal expansion of the resin interlayer insulating layers 33 to 36 for the second temperature range α2 is set to 39 ppm/° C., the value of the coefficient of thermal expansion thereof for the first temperature range α1 is set to 161 ppm/° C., and the absolute value of a difference thereof is set to be equal to or larger than 50 ppm/° C. When the difference between the coefficients of thermal expansion of the resin filling portion 92 for the temperature ranges α1 and α2 is small as described above, the mismatch of the coefficients of thermal expansion for the first temperature range α1, which is lower than the glass transition temperature also can be suppressed, in addition to the second temperature range α2 that is higher than the glass transition temperature. In such a case, the mismatch of the coefficients of thermal expansion can be reduced, compared to a case where the resin filling portion 92 is formed using the same material as that of the resin interlayer insulating layers 33 to 36, and thereby the swelling of the mounting area 23 for the IC chip 21 can be assuredly suppressed.

(3) For the case of the component built-in wiring substrate 10 according to this embodiment, the Young's modulus (=7.6 GPa) of the resin filling portion 92 is larger than the Young's modulus (=3.5 GPa) of the resin interlayer insulating layers 33 to 36. In addition, the tension strength (=1.70) of the resin filling layer 92 is smaller than the tension strength (=5.0%) of the resin interlayer insulating layers 33 to 36. Accordingly, compared to a case where the resin filling portion 92 is formed by using the same resin material as that of the resin interlayer insulating layers 33 to 36, the swelling of the mounting area 23 for the IC chip 21 can be suppressed more assuredly.

(4) In the case of the component built-in wiring substrate 10 according to this embodiment, the resin filling portion 92 contains silica filler in an amount of 68 wt % based on the weight of the filler and epoxy resin. Accordingly, the value of the coefficient of thermal expansion of the resin filling portion 92 for the second temperature area α2 can be decreased, whereby the swelling of the mounting area 23 for the IC chip 21 can be suppressed.

(5) In this embodiment, in the resin filling process, the epoxy resin film 173 having a sheet shape is disposed on the core principal surface 12 and the capacitor principal surface 102, and is heated and pressurized. This epoxy resin film 173 has a silica filler content greater than a general resin film used in the buildup layers 31 and 32, and accordingly, the flowability thereof is decreased. Accordingly, as in this embodiment, by heating and pressurizing the resin film 173, the resin material is sufficiently filled in the gap between the inner wall face 91 of the housing hole portion 90 and the ceramic capacitor 101 so as to form the resin filling portion 92. This resin filling portion 92 is formed without any gap inside the housing hole portion 90 and can prevent generation of cracks, whereby the ceramic capacitor 101 can be fixed to the core substrate 11 assuredly.

(6) According to the ceramic capacitor 101 of this embodiment, a plurality of via conductors 131 and 132 is disposed in an array shape as a whole. Accordingly, the inductance of the ceramic capacitor 101 is decreased. Therefore, noise can be absorbed, and a high-speed supply of the power source for smoothing the variation in the power source can be implemented. In addition, miniaturization of the entire ceramic capacitor 101 can be easily achieved, and moreover, miniaturization of the entire wiring substrate can be easily achieved. Furthermore, high static capacitance can be easily achieved with respect to size, and accordingly, power can be supplied to the IC chip 21 more stably.

In addition, the embodiment of the present invention may be modified as follows.

Figure 13:
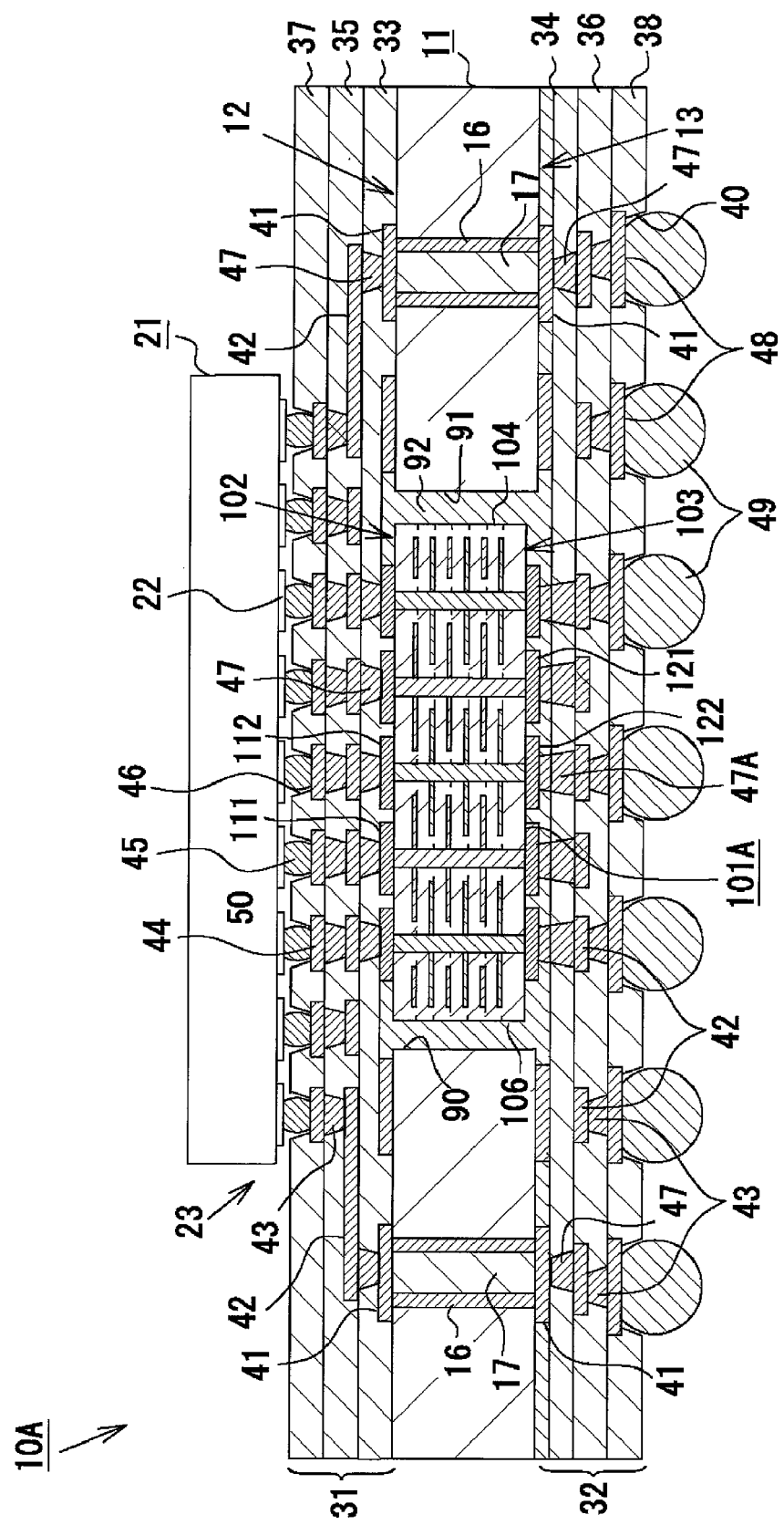
FIG. 13 is a schematic cross-sectional view of a component built-in wiring substrate according to another embodiment of the invention.

In the ceramic capacitor 101 that is built in the component built-in wiring substrate 10 of this embodiment, the external electrodes 111 and 112 are formed only on the capacitor principal surface 102 side. However, the invention is not limited thereto. As the component built-in wiring substrate 10A shown in FIG. 13, the ceramic capacitor 101A in which the external electrodes 121 and 122 are formed on the capacitor rear surface 103 side in addition to the external electrodes 111 and 112 formed on the capacitor principal surface 102 side may be built in. In this ceramic capacitor 101A, the external electrode 121 is directly connected to the end face of the in-capacitor via conductor 131 for the power source that is located on the capacitor rear surface 103 side, and the external electrode 122 is directly connected to the end faces of the plurality of the in-capacitor via conductors 132 for the ground that is located on the capacitor rear surface 103 side. In addition, the external electrodes 121 and 122 located on the capacitor rear surface 103 side are connected to the resin filling portion 92 covering the capacitor rear surface 103 side and the via conductor 47A that is formed by perforating the resin interlayer insulating layer 34 and is connected to a motherboard, not shown in the figure, through the via conductor 47A, the conductive layer 42, the via conductor 43, the BGA pad 48 and the solder bump 49. Even in a case where the wiring substrate 10A is configured as such, the mismatch of the coefficients of thermal expansion of the core substrate 11, the ceramic capacitor 101A, and the resin filling portion 92 can be reduced, whereby the swelling of the mounting area 23 for the IC chip 21 can be suppressed.

In the component built-in wiring substrate 10 of this embodiment, the housing hole portion 90 (through hole) that is opened on the core principal surface 12 and the core rear surface 13 are formed in the core substrate 11, and the ceramic capacitor 101 is housed in the housing hole portion 90. However, the invention is not limited thereto. For example, it may be configured so that a bottomed housing hole portion that is opened on the core principal surface 12 is formed in the core substrate 11, and the ceramic capacitor 101 is housed in the housing hole portion.

In the above-described embodiment, the epoxy resin film 173 (manufactured by Ajinomoto Co., Inc.; product name: ABF-TH3) in which a silica filler in an amount of 68 wt % based on the weight of the filler and epoxy resin is contained in the epoxy resin is used for forming the resin filling portion 92. However, other resin materials may be used. In particular, for example, a resin film (manufactured by Ajinomoto Co., Inc.; product name: ABF-GZ22) in which a silica filler in an amount of 55 wt % based on the weight of the filler and epoxy resin is contained in a resin material formed of an epoxy resin and a cyanate resin may be used. As the characteristics of this resin film, the coefficient of thermal expansion for the first temperature range α1 (a temperature range of 25° C. to 150° C.) is 31 ppm/° C., and the coefficient of thermal expansion for the second temperature range α2 (the temperature range of 150° C. to 240° C.) is 88 ppm/° C. In addition, the glass transition temperature (Tg) as measured by TMA is 166° C., and the glass transition temperature (Tg) as measured by DMA is 192° C. In addition, the Young's modulus is 6.2 GPa, the tension strength is 117 MPa, and the coefficient of extension is 3.4%. Even when such a thermosetting resin having a sheet shape is used, in the temperature range in which the solder bump 45 is melted, the mismatch of the coefficients of thermal expansion of the core substrate 11, the ceramic capacitor 101, and the resin filling portion 92 can be reduced, whereby swelling of the mounting area 23 for the IC chip 21 can be suppressed.

It should be further be apparent to those skilled in the art that various changes in form and detail of the invention as shown and described above may be made. It is intended that such changes be included within the spirit and scope of the claims appended hereto.

This application is based on Japanese Patent Application No. 2008-262013, filed on Oct. 8, 2008, the disclosure of which is herein incorporated by reference in its entirety.

What is claimed is:

1. A component built-in wiring substrate comprising:
    a core substrate, which is formed of a resin, including a core principal surface, a core rear surface, and a housing hole portion having an opening on the core principal surface side;
    a plate-shaped component, which is formed of a ceramic material, that has a component principal surface and a component rear surface and is housed in the housing hole portion in a state in which the core principal surface and the component principal surface are disposed to face a same side;
    a resin filling portion that is filled in a gap between an inner wall face of the housing hole portion and the plate-shaped component and that fixes the plate-shaped component to the core substrate; and
    a wiring stacking portion that is formed by alternately stacking resin interlayer insulating layers and a conductive layer on the core principal surface and the component principal surface and that has a plurality of solder bumps disposed inside a mounting area for mounting a chip component configured on the uppermost layer,
    wherein, when viewed from the core principal surface side, the projected area of the mounting area is larger than the projected area of the plate-shaped component and the resin filling portion, and the plate-shaped component and the resin filling portion are positioned directly below the mounting area, and
    wherein a value of the coefficient of thermal expansion (CTE α2) for a temperature range that is equal to or higher than the glass transition temperature of the resin filling portion is set to be larger than a value of the coefficient of thermal expansion of the plate-shaped component for said temperature range and is set to be smaller than the value of the coefficient of thermal expansion of the core substrate for said temperature range.

2. The component built-in wiring substrate according to claim 1,
    wherein the absolute value of a difference between the value of the coefficient of thermal expansion (CTE α2) of the resin filling portion for the temperature range that is equal to or higher than the glass transition temperature and a value of the coefficient of thermal expansion (CTE α1) of the resin filling portion for a temperature range that is lower than the glass transition temperature is equal to or smaller than 50 ppm/° C.

3. The component built-in wiring substrate according to claim 2,
    wherein the value of the coefficient of thermal expansion (CTE α2) of the resin filling portion for the temperature range that is equal to or higher than the glass transition temperature is equal to or smaller than 90 ppm/° C.

4. The component built-in wiring substrate according to claim 3,
    wherein the value of the coefficient of thermal expansion (CTE α2) of the resin filling portion for the temperature range that is equal to or higher than the glass transition temperature is equal to or smaller than 60 ppm/° C.

5. The component built-in wiring substrate according to claim 1,
    wherein the Young's modulus of the resin filling portion is equal to or larger than 6.0 GPa.

6. The component built-in wiring substrate according to claim 1,
    wherein the coefficient of extension of the resin filling portion is equal to or smaller than 3.5%.

7. The component built-in wiring substrate according to claim 1,
    wherein the resin of the resin filling portion contains an inorganic filler, and
    wherein the content of the inorganic filler is equal to or larger than 50 wt % based on the weight of the inorganic filler and the resin.

8. The component built-in wiring substrate according to claim 1,
    wherein the plate-shaped component is a ceramic capacitor.

9. The component built-in wiring substrate according to claim 1,
    wherein the plate-shaped component has a structure in which a plurality of internal electrode layers are disposed so as to be stacked through a ceramic dielectric layer and includes a plurality of in-capacitor via conductors, which in-capacitor conductors are connected to respective ones of the plurality of internal electrode layers, and a plurality of surface layer electrodes connected to at least end portions of the plurality of respective ones of the in-capacitor via conductors that are located on the component principal surface side, and
    wherein the plurality of in-capacitor via conductors are arranged in an array so as to define a ceramic capacitor.

10. A component built-in wiring substrate comprising:
    a core substrate, which is formed of a resin, including a core principal surface, a core rear surface, and a housing hole portion having an opening on the core principal surface side;
    a plate-shaped component, which is formed of a ceramic material, that has a component principal surface and a component rear surface and is housed in the housing hole portion in a state in which the core principal surface and the component principal surface are disposed to face a same side;
    a resin filling portion that is filled in a gap between an inner wall face of the housing hole portion and the plate-shaped component and that fixes the plate-shaped component to the core substrate; and
    a wiring stacking portion that is formed by alternately stacking resin interlayer insulating layers and a conductive layer on the core principal surface and the component principal surface and that has a plurality of solder bumps disposed inside a mounting area for mounting a chip component configured on the uppermost layer, wherein, when viewed from the core principal surface side, the projected area of the mounting area is larger than the projected area of the plate-shaped component and the resin filling portion, and the plate-shaped component and the resin filling portion are positioned directly below the mounting area, and wherein a value of the coefficient of thermal expansion (CTE $\alpha 2$) for a temperature range that is equal to or higher than the glass transition temperature of the resin filling portion is set to be larger than a value that is acquired by decreasing a value of the coefficient of thermal expansion of the plate-shaped component for said temperature range by 10% and is set to be smaller than a value that is acquired by increasing a value of the coefficient of thermal expansion of the core substrate for said temperature range by 10%.

11. A component built-in wiring substrate comprising:

a core substrate, which is formed of a resin, including a core principal surface, a core rear surface, and a housing hole portion having an opening on the core principal surface side;

a plate-shaped component, which is formed of a ceramic material, that has a component principal surface and a component rear surface and is housed in the housing hole portion in a state in which the core principal surface and the component principal surface are disposed to face a same side;

a resin filling portion that is filled in a gap between an inner wall face of the housing hole portion and the plate-shaped component and that fixes the plate-shaped component to the core substrate; and a wiring stacking portion that is formed by alternately stacking resin interlayer insulating layers and a conductive layer on the core principal surface and the component principal surface and that has a plurality of solder bumps disposed inside a mounting area for mounting a chip component configured on the uppermost layer, wherein, when viewed from the core principal surface side, the projected area of the mounting area is larger than the projected area of the plate-shaped component and the resin filling portion, and the plate-shaped component and the resin filling portion are positioned directly below the mounting area, and wherein a value of the coefficient of thermal expansion (CTE $\alpha 1$) for a temperature range that is lower than the glass transition temperature of the resin filling portion is set to be larger than a value of the coefficient of thermal expansion of the plate-shaped component for said temperature range and is set to be smaller than the value of the coefficient of thermal expansion of the core substrate for said temperature range.

12. The component built-in wiring substrate according to claim 11, wherein the absolute value of a difference between the value of the coefficient of thermal expansion (CTE $\alpha 2$) of the resin filling portion for the temperature range that is equal to or higher than the glass transition temperature and a value of the coefficient of thermal expansion (CTE $\alpha 1$) of the resin filling portion for a temperature range that is lower than the glass transition temperature is equal to or smaller than 50 ppm/° C.

13. The component built-in wiring substrate according to claim 12, wherein the value of the coefficient of thermal expansion (CTE $\alpha 2$) of the resin filling portion for the temperature range that is equal to or higher than the glass transition temperature is equal to or smaller than 90 ppm/° C.

14. The component built-in wiring substrate according to claim 13, wherein the value of the coefficient of thermal expansion (CTE $\alpha 2$) of the resin filling portion for the temperature range that is equal to or higher than the glass transition temperature is equal to or smaller than 60 ppm/° C.

15. The component built-in wiring substrate according to claim 11, wherein the Young's modulus of the resin filling portion is equal to or larger than 6.0 GPa.

16. The component built-in wiring substrate according to claim 11, wherein the coefficient of extension of the resin filling portion is equal to or smaller than 3.5%.

17. The component built-in wiring substrate according to claim 11, wherein the resin of the resin filling portion contains an inorganic filler, and wherein the content of the inorganic filler is equal to or larger than 50 wt % based on the weight of the inorganic filler and the resin.

18. The component built-in wiring substrate according to claim 11, wherein the plate-shaped component is a ceramic capacitor.

19. The component built-in wiring substrate according to claim 11, wherein the plate-shaped component has a structure in which a plurality of internal electrode layers are disposed so as to be stacked through a ceramic dielectric layer and includes a plurality of in-capacitor via conductors, which in-capacitor conductors are connected to respective ones of the plurality of internal electrode layers, and a plurality of surface layer electrodes connected to at least end portions of the plurality of respective ones of the in-capacitor via conductors that are located on the component principal surface side, and wherein the plurality of in-capacitor via conductors are arranged in an array so as to define a ceramic capacitor.

20. A component built-in wiring substrate comprising:

a core substrate, which is formed of a resin, including a core principal surface, a core rear surface, and a housing hole portion having an opening on the core principal surface side;

a plate-shaped component, which is formed of a ceramic material, that has a component principal surface and a component rear surface and is housed in the housing hole portion in a state in which the core principal surface and the component principal surface are disposed to face a same side;

a resin filling portion that is filled in a gap between an inner wall face of the housing hole portion and the plate-shaped component and that fixes the plate-shaped component to the core substrate; and a wiring stacking portion that is formed by alternately stacking resin interlayer insulating layers and a conductive layer on the core principal surface and the component principal surface and that has a plurality of solder bumps disposed inside a mounting area for mounting a chip component configured on the uppermost layer, wherein, when viewed from the core principal surface side, the projected area of the mounting area is larger than the projected area of the plate-shaped component and the resin filling portion, and the plate-shaped component and the resin filling portion are positioned directly below the mounting area, and wherein a value of the coefficient of thermal expansion (CTE $\alpha 1$) for a temperature range that is lower than the glass transition temperature of the resin filling portion is set to be larger than a value that is acquired by decreasing a value of the coefficient of thermal expansion of the plate-shaped component for said temperature range by 10% and is set to be smaller than a value that is acquired by increasing the value of the coefficient of thermal expansion of the core substrate for said temperature range by 10%.

* * * * *